US007067966B2

(12) United States Patent
Tanaya (10) Patent No.: US 7,067,966 B2
(45) Date of Patent: Jun. 27, 2006

(54) PIEZOELECTRIC DEVICE, CELLULAR PHONE SYSTEM USING THE PIEZOELECTRIC DEVICE, AND ELECTRONIC EQUIPMENT USING THE PIEZOELECTRIC DEVICE

(75) Inventor: Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 19 days.

(21) Appl. No.: 10/951,268

(22) Filed: Sep. 27, 2004

(65) Prior Publication Data
US 2005/0104480 A1      May 19, 2005

(30) Foreign Application Priority Data
Sep. 29, 2003   (JP)   ............................. 2003-338558

(51) Int. Cl.
    *H01L 41/08*       (2006.01)
(52) U.S. Cl. ....................... 310/367; 310/344; 310/370
(58) Field of Classification Search ........... 310/323.11, 310/344, 370, 365, 321
See application file for complete search history.

(56) References Cited

U.S. PATENT DOCUMENTS

| | | | | |
|---|---|---|---|---|
| 4,384,232 | A | | 5/1983 | Debely ........................ 310/370 |
| 4,421,621 | A | * | 12/1983 | Fujii et al. .............. 204/192.12 |
| 6,407,485 | B1 | * | 6/2002 | Aratake ....................... 310/344 |
| 6,806,797 | B1 | * | 10/2004 | Kikushima ................... 333/200 |
| 6,897,737 | B1 | * | 5/2005 | Sakata et al. ................ 331/156 |
| 6,897,743 | B1 | * | 5/2005 | Kawashima ................. 333/187 |
| 6,903,618 | B1 | * | 6/2005 | Kawashima ................. 331/158 |
| 6,927,530 | B1 | * | 8/2005 | Tanaya et al. .............. 310/348 |

FOREIGN PATENT DOCUMENTS

| | | |
|---|---|---|
| JP | 53-23588 | 4/1978 |
| JP | 2002-261575 | 9/2002 |
| JP | 2002261575 A * | 9/2002 |
| JP | 2003-069368 | 3/2003 |

OTHER PUBLICATIONS

Communication from European Patent Office regarding related application.

* cited by examiner

*Primary Examiner*—Mark Budd
(74) *Attorney, Agent, or Firm*—Harness, Dickey & Pierce, P.L.C.

(57) ABSTRACT

A piezoelectric device includes a base substrate constituting the bottom of the package; a framed resonator element layered on the base substrate; and a lid for hermetically sealing a space within the package, the lid being layered on the framed resonator element. The framed resonator element includes a frame constituting a wall surrounding the space within the package; a base having a predetermined width, which is integrally formed inside the frame; a plurality of resonating arms that extend in parallel to each other from the base in one direction in the frame; first cutouts that are provided near the base ends of the resonating arms in the base; and second cutouts formed at the joint between the base and the frame.

7 Claims, 9 Drawing Sheets

PRIOR ART

FIG. 12

PRIOR ART

FIG. 13A

DROPPING CHARACTERISTICS (VARIATION IN CI VALUE ΔCI)

PRIOR ART

FIG. 13B

DROPPING CHARACTERISTICS (VARIATION IN FREQUENCY Δf)

PRIOR ART

PIEZOELECTRIC DEVICE, CELLULAR PHONE SYSTEM USING THE PIEZOELECTRIC DEVICE, AND ELECTRONIC EQUIPMENT USING THE PIEZOELECTRIC DEVICE

RELATED APPLICATIONS

This application claims priority to Japanese Patent Application No. 2003-338558 filed Sep. 29, 2003 which is hereby expressly incorporated by reference herein in its entirety.

BACKGROUND

1. Technical Field

The present invention relates to a piezoelectric device having a resonator element housed in a package, a cellular phone system using the piezoelectric device, and electronic equipment using the piezoelectric device.

2. Background Art

Piezoelectric devices, such as piezoelectric transducers or piezoelectric oscillators, are in widespread use in hard disk drives (HDDs), mobile computers, small computer equipment including IC cards, and mobile communication equipment including cellular phones, automobile telephones, and paging systems.

Figure 11:
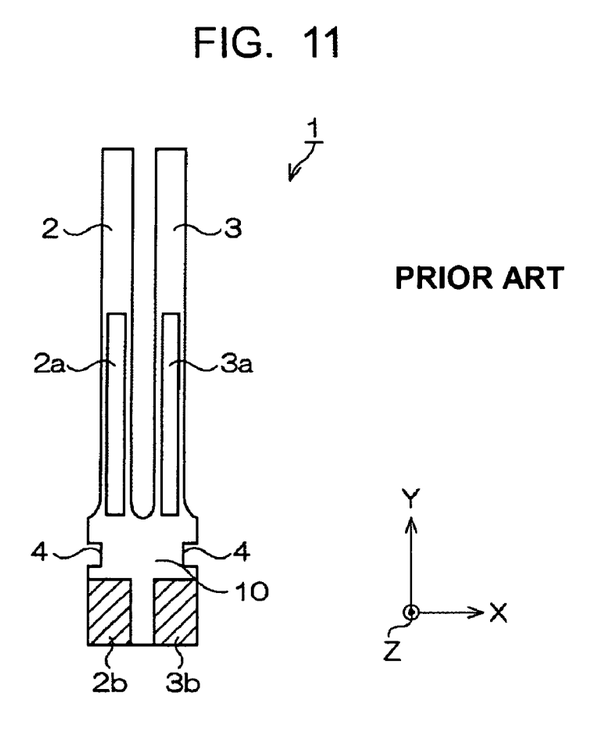
FIG. 11 is a schematic plan view of a resonator element used in a known piezoelectric device.

A known piezoelectric device has, for example, a resonator element shown in FIG. 11 housed in a package (refer to Japanese Unexamined Patent Application Publication No. 2002-261575).

Referring to FIG. 11, a resonator element 1 formed by etching, for example, crystal is a so-called tuning-fork-type resonator element, which has a base 10 and a pair of resonating arms 2 and 3 that extend in parallel to each other from the base 10.

Grooves 2a and 3a extending in the longitudinal direction of the resonating arms 2 and 3 are formed in the resonating arms 2 and 3, respectively. Drive electrodes (not shown) are formed in the grooves 2a and 3a. Cutouts 4, 4 are formed at opposing ends in the width direction at the outer end of the base.

The resonator element 1 is housed in, for example, a box-shaped package (not shown) and is adhered on the inner surface of the package where electrode parts connected to external terminals are provided. Conductive adhesive is applied on the electrodes. The base 10 of the resonator element 1 is mounted on the conductive adhesive and then cured. Extraction electrodes 2b and 3b of the base 10 are adhered to the electrode parts, separated from each other at the package side, with the corresponding conductive adhesive to be electrically and mechanically connected and fixed to the electrode parts.

The base 10 of the resonator element 1 forms an adhesion area to which the package is adhered, as described above, and has a certain size so as to make the transmission of a vibration of the resonating arms 2 and 3 toward the package difficult. The resonator element 1 has the cutouts 4, 4 formed in the base 10 in order to make the transmission of a vibration of the resonating arms 2 and 3 difficult.

Figure 12:
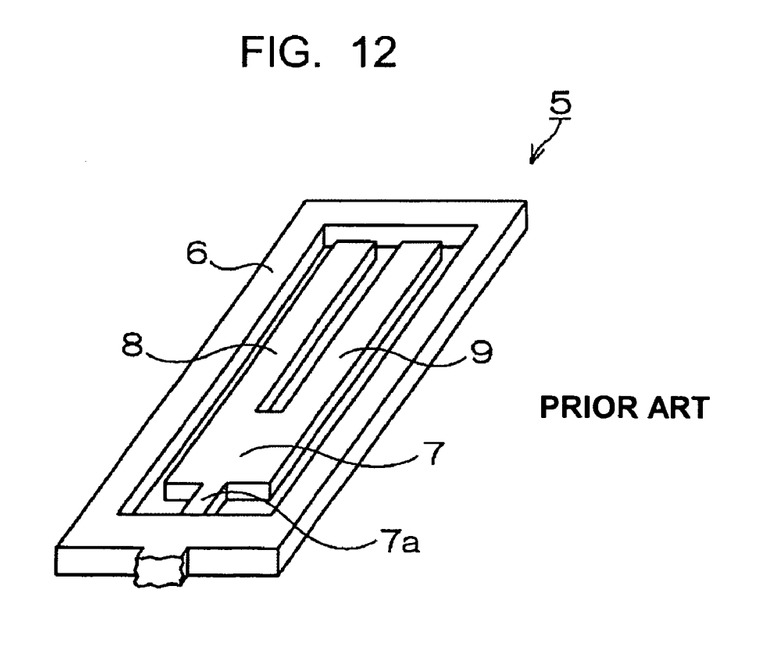
FIG. 12 is a schematic plan view of a resonator element used in another known piezoelectric device.

A resonator element 5 shown in FIG. 12 is also known (refer to Japanese Unexamined Patent Application Publication No. 53-23588).

The resonator element 5 has a rectangular frame 6. A tuning-fork-type resonator element body is integrally formed inside the frame 6 through a connecting part 7a. Specifically, the resonator element body has a base 7 and resonating arms 8 and 9 that extend in parallel to each other from the base 7 inside the frame 6. The base 7 and the resonating arms 8 and 9 are connected to the frame 6 through the integrally formed narrow connecting part 7a.

However, since the resonator element 1 described with reference to FIG. 11 has a structure in which the base 10 is adhered on the inner surface of the package, the resonator element 1 to be housed in the package is reduced in size when the piezoelectric device is downsized. Particularly, it is difficult to use the conductive adhesives to adhere the extraction electrodes to the base 10 with the extraction electrodes being electrically separated from the base 10. In other words, it becomes difficult to apply a small amount of the conductive adhesive to the electrodes separated from each other at minute intervals on the inner surface of the package so as not to short-circuit the electrodes. Since it is necessary to limit the amount of applied conductive adhesive for preventing the electrodes from being short-circuited, the adhesion strength of the resonator element 1 becomes insufficient.

In contrast, since the resonator element 5 shown in FIG. 12 uses the frame 6 as part of the package and the resonator element 5 is sandwiched between an insulating substrate (not shown) and a lid (not shown) and fixed, there is no need to employ an adhesion structure in the package of the resonator element. Hence, the problems described above when the resonator element 1 in FIG. 11 is used can be solved and the resonator element 5 in FIG. 12 is advantageous in terms of size reduction of the piezoelectric device.

However, in the resonator element 5 in FIG. 12, the fixed frame 6 used as part of the package is connected to the resonator element body that flexes and vibrates in response to a piezoelectric action through the extremely narrow connecting part 7a in order not to inhibit the resonator element body from vibrating as much as possible. As a result, when an external impact is applied, the stress is concentrated on the extremely narrow connecting part 7a and, therefore, the connecting part 7a is in danger of being damaged. Accordingly, it is disadvantageously difficult to form the piezoelectric device having a sufficient impact resistance.

When the base 7 having a width larger than that of the connecting part 7a is directly formed inside the frame 6, without forming the connecting part 7a, in the resonator element 5 shown in FIG. 12 in order to avoid breakage, the base 7 inhibits the vibration of the resonator element body unless the base 7 has a sufficient length and size. Furthermore, a drop test conducted by the inventors et al. shows that, when the piezoelectric device is formed by using the resonator element having the structure in FIG. 12, an external impact is transmitted to the resonator element body through the frame 6 used as part of the package and the base 7, and the piezoelectric device is affected as shown in FIGS. 13(a) and 13(b).

Figure 13A:
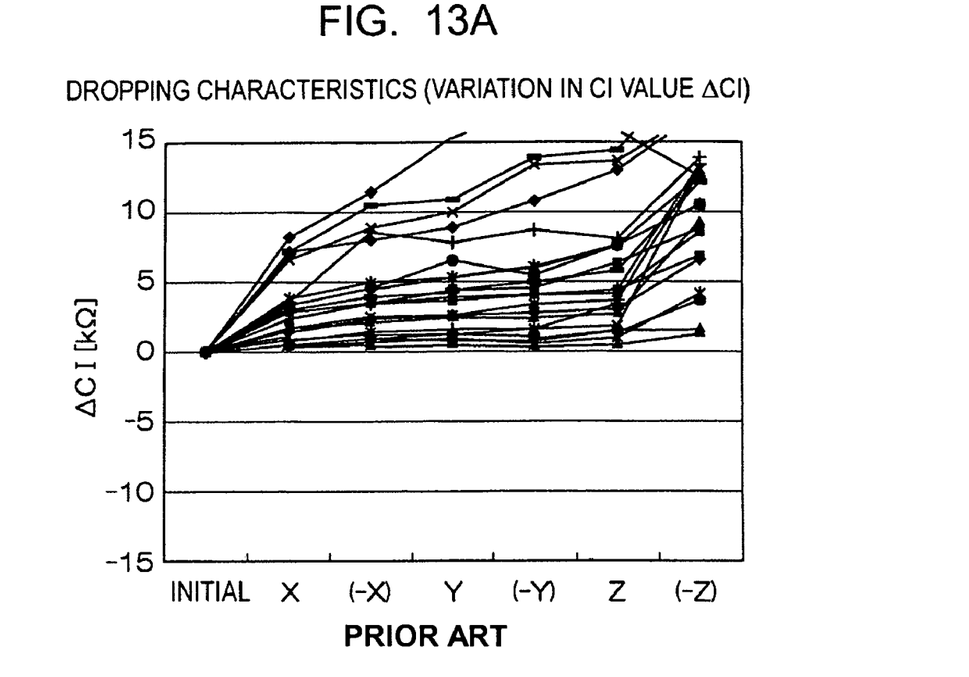
FIG. 13 is a graph showing changes in CI values and frequency in a drop test of a piezoelectric device in which the resonator element in FIG. 11 is housed.
Figure 13B:
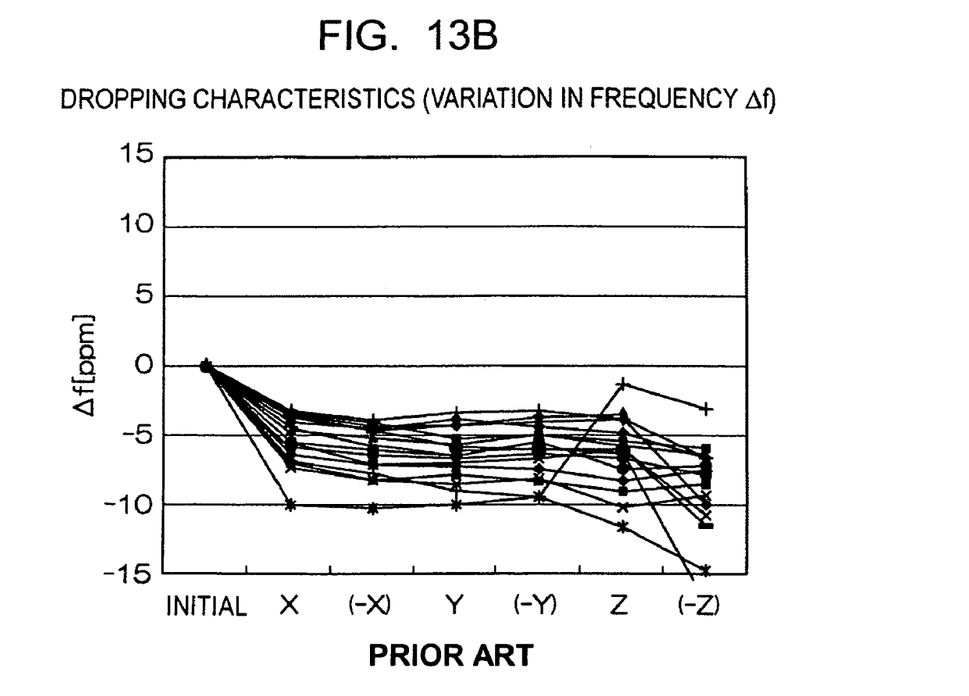

FIG. 13(a) is a graph showing the increase in crystal impedance (CI) values of the piezoelectric device due to a dropping impact. FIG. 13(b) is a graph showing the variation in frequency of the piezoelectric device due to the dropping impact. Reference letters X, Y, and Z in FIGS. 13(a) and 13(b) denote directions represented by reference letters X, Y, and Z in FIG. 1 and indicate the directions of dropping in the drop test. As shown in FIGS. 13(a) and 13(b), the piezoelectric device is adversely and significantly affected in its performance.

In order to solve the problems described above, it is an object of the present invention to provide a piezoelectric device capable of achieving a sufficient impact resistance even when the product is reduced in size, a cellular phone system using the piezoelectric device, and electronic equipment using the piezoelectric device.

SUMMARY

The present invention provides, in its first aspect, a piezoelectric device having a resonator element housed in a package. The piezoelectric device includes a base substrate constituting the bottom of the package; a framed resonator element layered on the base substrate; and a lid for hermetically sealing a space within the package, the lid being layered on the framed resonator element. The framed resonator element includes a frame constituting a wall surrounding the space within the package; a base having a predetermined width, which is integrally formed inside the frame; a plurality of resonating arms that extend in parallel to each other from the base in one direction in the frame; first cutouts that are provided near the base ends of the resonating arms in the base and that are formed to narrow the width of the base; and second cutouts that are formed at the joint between the base and the frame to narrow the width of the base.

The piezoelectric device having the structure according to the first aspect of the present invention uses the framed resonator element, and the frame of the framed resonator element constitutes the wall surrounding the space within the package. The base and the resonator element body including the multiple resonating arms extending from the base are integrally formed inside the frame. Accordingly, there is no need to adhere the resonator element inside the package with an adhesive, so that the piezoelectric device can be easily reduced in size.

Since the resonator element body is not connected to the frame through the extremely narrow connecting part and the base having a relatively large width extends from the frame, there is no structurally weak part, unlike the known resonator element, and there is also no part on which the stress due to an external impact is apt to be concentrated and which is apt to be damaged.

The first cutouts are provided near the inner or base ends of the resonating arms in the base and, thus, it is possible to effectively inhibit a vibration leakage from the resonating arms from being transmitted to the base.

The second cutouts are provided at the joint between the base and the frame to narrow the width of the base. In other words, the frame constitutes the external wall of the package in the piezoelectric device, so that an impact due to dropping or the like strongly acts on the frame. As described above, no narrow connecting part is connected to the base, and the base having a relatively large width resists the impact well to prevent the piezoelectric device from being damaged. In addition, the second cutouts reduce the stress on the frame based on the impact transmitted to the resonator element body, thus effectively suppressing a change in CI values or a change in frequency.

Hence, according to the present invention, it is possible to provide a piezoelectric device capable of achieving a sufficient impact resistance even when the product is reduced in size.

A second aspect of the present invention is characterized in that the width of the second cutouts is 25% to 75% of the width of the base in the structure according to the first aspect of the present invention.

With the structure according to the second aspect of the present invention, when the width of the second cutouts is less than 25% of the width of the base, the strength is insufficient to attain the impact resistance. However, when the width of the second cutouts exceeds 75% of the width of the base, the stress due to an impact on the frame transmitted to the resonator element body cannot be reduced to a sufficient level.

A third aspect of the present invention is characterized in that the width of the base is less than 500 μm in the structure according to the first aspect of the present invention.

With the structure according to the third aspect of the present invention, when the width of the base is not less than 500 μm, it is possible to avoid adhering the electrodes of the base by using conductive adhesives to prevent short-circuiting and, therefore, this structure is not advantageous.

A fourth aspect of the present invention is characterized in that each of the resonating arms of the resonator element has grooves extending in the longitudinal direction of the resonating arm and excitation electrodes are formed in the grooves in the structure according to any of the first to third aspects of the present invention.

With the structure according to the fourth aspect of the present invention, forming the grooves in the resonating arm and providing the excitation electrodes can effectively produce an electric field inside the piezoelectric material to excite a current.

The present invention provides, in its fifth aspect, a piezoelectric device having a resonator element housed in a package. The piezoelectric device includes a base substrate constituting the bottom of the package; a framed resonator element adhered on the base substrate; and a lid for housing the framed resonator element in the package to hermetically seal the package with the framed resonator element being adhered to the base substrate. The framed resonator element includes a rectangular frame; a base having a predetermined width, which is integrally formed inside the frame; a plurality of resonating arms that extend in parallel to each other from the base in one direction; first cutouts that are provided near the base ends of the resonating arms in the base and that are formed to narrow the width of the base; and second cutouts that are formed at the joint between the base and the frame to narrow the width of the base.

With the structure according to the fifth aspect of the present invention, since the resonator element body of the framed resonator element is not connected to the frame through the extremely narrow connecting part and the base having a relatively large width extends from the frame, there is no structurally weak part, unlike the known resonator element, and there is also no part on which the stress due to an external impact is apt to be concentrated and which is apt to be damaged.

The first cutouts are provided near the base ends of the resonating arms in the base and, thus, it is possible to effectively inhibit a vibration leakage from the resonating arms from being transmitted to the base.

The second cutouts are provided at the joint between the base and the frame to narrow the width of the base. In other words, the piezoelectric device houses the framed resonator element in the package and the framed resonator element can be adhered to the package by using the frame, so that the adhesion can be easily performed, compared with a case where the base of a small resonator element is adhered to the package. Since the resonator element body does not have the narrow connecting part described above, while an impact due to dropping or the like is transmitted to the frame connected to the package, the base having a relatively large width resists the impact well to prevent the piezoelectric device from being damaged. In addition, the second cutouts reduce the stress on the frame based on the impact transmitted to the resonator element body, thus effectively suppressing a change in CI values or a change in frequency.

The present invention provides, in its sixth aspect, a cellular phone system using a piezoelectric device that has a resonator element housed in a package. The piezoelectric device includes a base substrate constituting the bottom of the package; a framed resonator element layered on the base substrate; and a lid for hermetically sealing a space within the package, the lid being layered on the framed resonator element. The framed resonator element includes a frame constituting the wall surrounding the space within the package; a base having a predetermined width, which is integrally formed inside the frame; a plurality of resonating arms that extend in parallel to each other from the base in one direction in the frame; first cutouts that are provided near the base ends of the resonating arms in the base and that are formed to narrow the width of the base; and second cutouts that are formed at the joint between the base and the frame to narrow the width of the base. The cellular phone system receives a clock signal for control by using the piezoelectric device.

The present invention provides, in its seventh aspect, electronic equipment using a piezoelectric device that has a resonator element housed in a package. The piezoelectric device includes a base substrate constituting the bottom of the package; a framed resonator element layered on the base substrate; and a lid for hermetically sealing a space within the package, the lid being layered on the framed resonator element. The framed resonator element includes a frame constituting the wall surrounding the space within the package; a base having a predetermined width, which is integrally formed inside the frame; a plurality of resonating arms that extend in parallel to each other from the base in one direction in the frame; first cutouts that are provided near the base ends of the resonating arms in the base and that are formed to narrow the width of the base; and second cutouts that are formed at the joint between the base and the frame to narrow the width of the base. The electronic equipment receives a clock signal for control by using the piezoelectric device.

DETAILED DESCRIPTION

Figure 1:
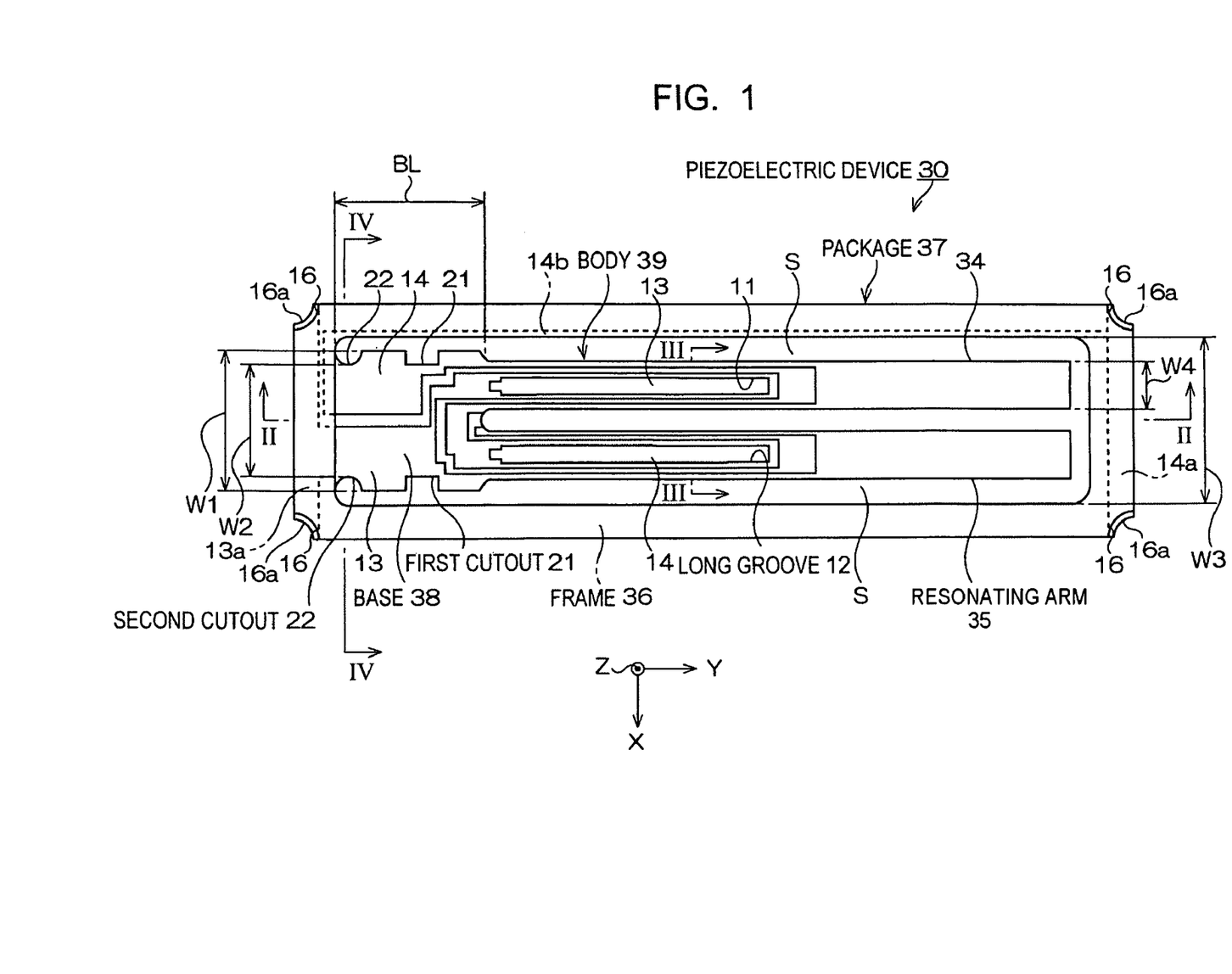
FIG. 1 is a schematic plan view of a piezoelectric device according to a first embodiment of the present invention.
Figure 2:
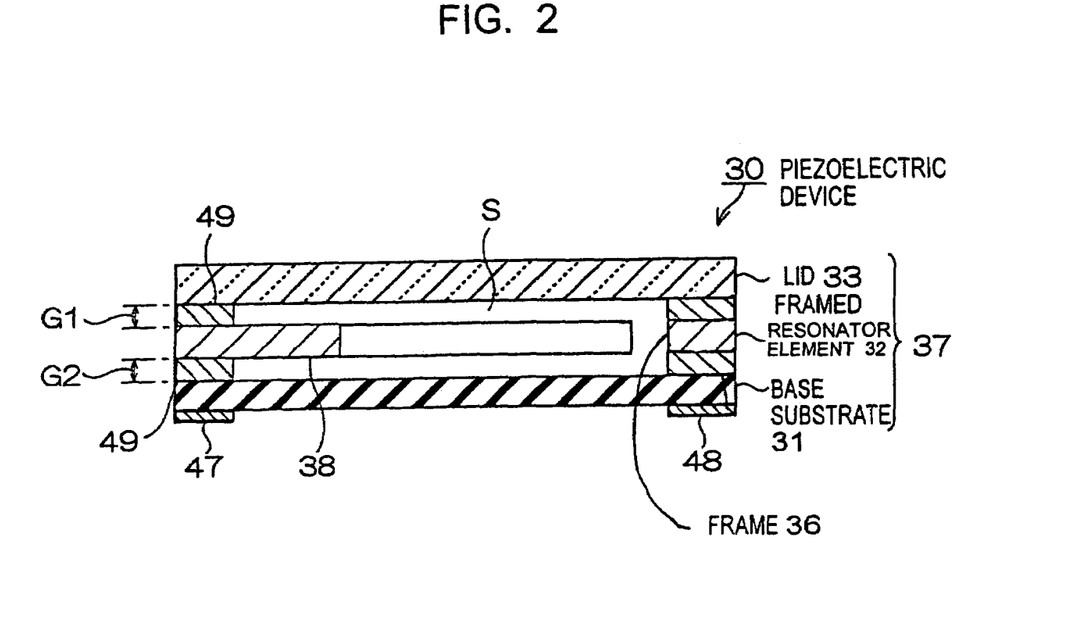
FIG. 2 is a schematic cross-sectional view of the piezoelectric device taken along line II—II in FIG. 1.
Figure 3:
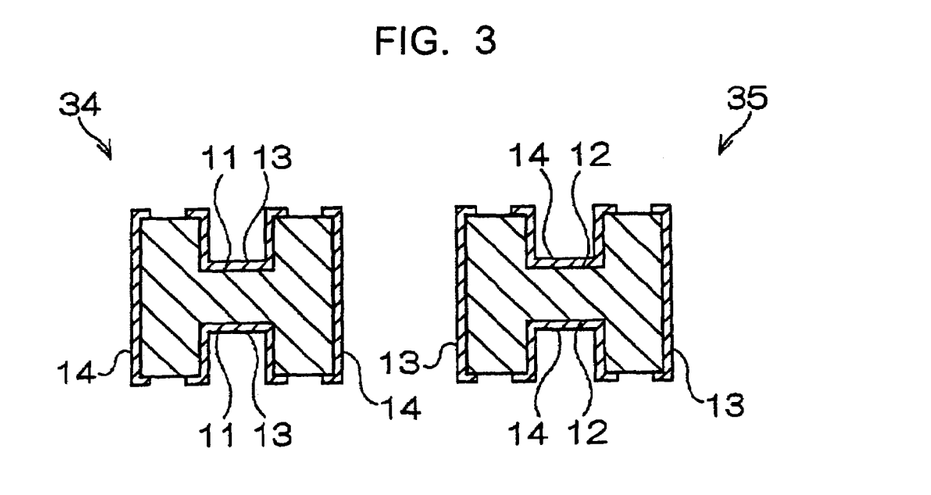
FIG. 3 is a sectional end view of the piezoelectric device taken along line III—III in FIG. 1.

FIGS. 1 to 3 show a first embodiment of a piezoelectric device according to the present invention. FIG. 1 is a schematic plan view of the piezoelectric device, FIG. 2 is a schematic cross-sectional view thereof taken along line II—II in FIG. 1, and FIG. 3 is a sectional end view thereof taken along line III—III in FIG. 1.

Referring to FIGS. 1 to 3, a piezoelectric device 30 constitutes a piezoelectric transducer. The piezoelectric device 30 has a resonator element housed in a package 37.

Specifically, the piezoelectric device 30 has a base substrate 31, a framed resonator element 32 that is fixed on the base substrate 31, and a lid 33 that is layered and fixed on the framed resonator element 32.

In the piezoelectric device 30, the package 37 for hermetically housing the resonator element is structured so as to include the base substrate 31, the frame of the framed resonator element 32, and the lid 33. In other words, layering the lid 33 on the framed resonator element 32 that is layered on the base substrate 31 to adhere the base substrate 31, the framed resonator element 32, and the lid 33 to each other forms the package 37.

The base substrate 31 is the bottom of the package 37. The base substrate 31 is formed of an insulating material and is preferably formed of ceramic. The base substrate 31 is particularly preferably formed of a material having a thermal expansion coefficient that is equal to or close to the thermal expansion coefficient of the framed resonator element 32 or the lid 33 described below. According to the first embodiment, for example, the base substrate 31 is formed of a green sheet made of glass ceramic. Shaping a mixture, generated by dispersing ceramic powder in a predetermined solution and adding a binder to the solution, into a long tape and cutting the tape into pieces having a predetermined length provides the green sheet.

In the first embodiment, the base substrate 31 is formed of a green sheet produced by mixing glass, forsterite ceramic ($2MgO.SiO_2$), and a binder.

Specifically, the glass ceramic contains the glass component at about 70% and the forsterite component at about 30% by weight in order to provide a thermal expansion coefficient of 13.8 ppm/° C., which is the thermal expansion coefficient of the Z-cut crystal that is used as the material of the framed resonator element 32, as described below. For example, the glass component contains 80% $SiO_2$, 12% $R_2O$(R denotes one Li and/or K), and 8% $P_2O_5$.

As shown in FIGS. 1 and 2, the framed resonator element 32 has a resonator element body 39 and a frame 36 that surrounds the resonator element body 39 in a rectangular shape and that is integrated with the resonator element body 39. The framed resonator element 32 is made of a piezoelectric material, for example, crystal. The framed resonator element 32 may be made of lithium tantalite or lithium niobate. Specifically, in the first embodiment, the framed resonator element 32 is formed into the shape shown in the drawing by performing wet etching on a wafer, which is a Z-cut crystal, by using a hydrofluoric acid solution or by performing dry etching of the wafer. The thermal expansion coefficient of the Z-cut crystal is 13.8 ppm/° C.

The resonator element body 39 has a plurality of (a pair of, in this embodiment) resonating arms 34 and 35 that extend rightward from a base 38 integrated with the frame 36 and that are parallel to each other, as shown in FIGS. 1 and 2. Referring to FIG. 3, long grooves 11, 11 and 12, 12 that extend in the longitudinal direction of each of the resonating arms 34 and 35 are formed on the front face and on the back face (on the top and underneath, in FIG. 2) of the resonating arms 34 and 35, respectively. Excitation electrodes 13 are formed inside the long grooves 11, 11 of the resonating arm 34 and excitation electrodes 14 are formed inside the long grooves 12, 12 of the resonating arm 35. The paired excitation electrodes 13 and the paired excitation electrodes 14 extend toward the base 38 and function as heteropolar electrodes with respect to each other. In order to efficiently form an electric field in the resonator element body 39, as shown in FIG. 3, the excitation electrodes 13 are formed inside the long grooves 11, 11 of the resonating arm 34 and the excitation electrodes 14 are formed on opposing side faces of the resonating arm 34. The excitation electrodes 14 are formed in the long grooves 12, 12 of the resonating arm 35 and the excitation electrodes 13 are formed on opposing side faces of the resonating arm 35.

First recesses or cutouts 21, 21 are formed near the base ends of the resonating arms 34 and 35 in the base 38 of the resonator element body 39. The first cutouts 21, 21 are formed to narrow the width of the base 38. Second recesses or cutouts 22, 22 are formed at the joint where the base 38 is integrally attached to the frame 36 of resonator element 32. The second cutouts 22, 22 are formed to narrow the width of the base 38. The first and second cutouts 21 and 22 are simultaneously formed when the crystal wafer is etched to form the outline of the framed resonator element 32.

As shown in FIG. 1, in the framed resonator element 32, the excitation electrodes 13 that extend toward the base 38 are lead to the leftward end to provide conductive patterns 13a extending in the width direction of the framed resonator element 32. The conductive patterns 13a are formed on the front face and on the back face of the framed resonator element 32. The excitation electrodes 14 that extend toward the base 38 are lead to the rightward end through a leading portion 14b along the frame 36 to provide conductive patterns 14a extending in the width direction of the framed resonator element 32. The conductive patterns 14a are formed on the front face and on the back face of the framed resonator element 32.

As shown in FIG. 2, mounting terminals 47 and 48 are formed at opposing longitudinal ends of the base substrate 31 beneath the back side (bottom) of the base substrate 31. As shown in FIG. 1, concave arcuate cut-away portions 16, 16, 16, 16, in the shape of a quarter circle which extend toward the inward direction of the piezoelectric device 30, are formed in the four corners of the package 37 in association with the mounting terminals 47 and 48. Conductive patterns 16a, 16a, 16a, 16a are formed on the outer front faces of the cut-away portions 16, 16, 16, 16.

The excitation electrodes 13 and 14 of the resonator element body 39 are electrically connected to the mounting terminals 47 and 48 via the conductive patterns 13a and 14a and the conductive patterns 16a on the cut-away portions 16 conductive by using a conductive paste or by metallization, including sputtering or plating.

The electrodes of the framed resonator element 32 are formed by sequentially depositing or sputtering, for example, chromium or gold after etching the crystal wafer.

The electrodes and conductive patterns on the base substrate 31 are formed by applying a conductive paste made of, for example, silver or palladium to the shaped green sheet described above, firing the green sheet, and sequentially plating the fired green sheet with, for example, nickel or gold. Alternatively, in order to prevent the base substrate 31 formed of a thin green sheet from deforming, a conductive paste including a copper paste may be applied on the shaped and fired green sheet and the green sheet may be dried and then plated.

The lid 33, which is fixed on the framed resonator element 32, hermetically seals a space S in which the resonator element body 39 is housed. The lid 33 is preferably made of a transparent material, such as crystal or glass, which can transmit a laser beam externally radiated for frequency adjustment after the lid 33 is sealed. In the case of crystal, the lid 33 is made of Z-cut crystal, as is the framed resonator element 32. In the case of glass, a transparent material having a thermal expansion coefficient substantially equal to 13.8 ppm/° C., which is the thermal expansion coefficient of the Z-cut crystal, is selected. Such materials include high-expansion glass, and do not include ordinary soda glass or borosilicate glass. In other words, the component ratio of high-expansion glass is adjusted to set the thermal expansion coefficient of it to 13.8 ppm/° C. described above.

The base substrate 31 is adhered to the framed resonator element 32 with a sealing material 49, and the framed resonator element 32 is adhered to the lid 33 with another sealing material 49.

The sealing materials 49, 49 are preferably formed of low-melting glass. Since the sealing materials 49, 49 made of the low-melting glass include filler serving as a spacer, predetermined gaps G1 and G2 are formed on and beneath the resonator element body 39 in the space S within the package 37, as shown in FIG. 2. Hence, the resonator element body 39 can vibrate as required without trouble, without abutting against the lid 33 or the inner face of the base substrate 31.

In the piezoelectric device 30 of the first embodiment having the structure described above, the framed resonator element 32 is used and the frame 36 of the framed resonator element 32 constitutes a wall around the space S within the package 37. The base 38 and the resonator element body 39 that includes the pair of resonating arms 34 and 35 extending from the base 38 are integrally formed inside the frame 36. Accordingly, there is no need to adhere the resonator element in the package 37 with an adhesive, thus easily reducing the size of the piezoelectric device 30.

The resonator element body 39 has no structurally weak part such as an extremely narrow connecting part connected to the frame 36, unlike the known resonator element described with reference to FIG. 12, and, therefore, the resonator element body 39 has no part on which the stress due to an external impact is likely to concentrate and which is apt to be damaged.

The first cutouts 21, 21 of the base 38 effectively inhibit a vibration leakage from the resonating arms 34 and 35 from being transmitted to the base 38.

In addition, the second cutouts 22, 22 are formed to narrow the joint between the base 38 and the frame 36 to a width W2.

In the piezoelectric device 30, since the frame 36 defines an external wall of the package 37, any impact due to dropping or the like is strongly exerted on the frame 36. The base 38 that has no narrow connecting part, as described above, and that has a relatively large width resists the impact well to prevent the piezoelectric device 30 from being damaged. In addition, the second cutouts 22, 22 reduce the stress on the frame 36 from the impact transmitted to the resonator element body 39.

Figure 4:
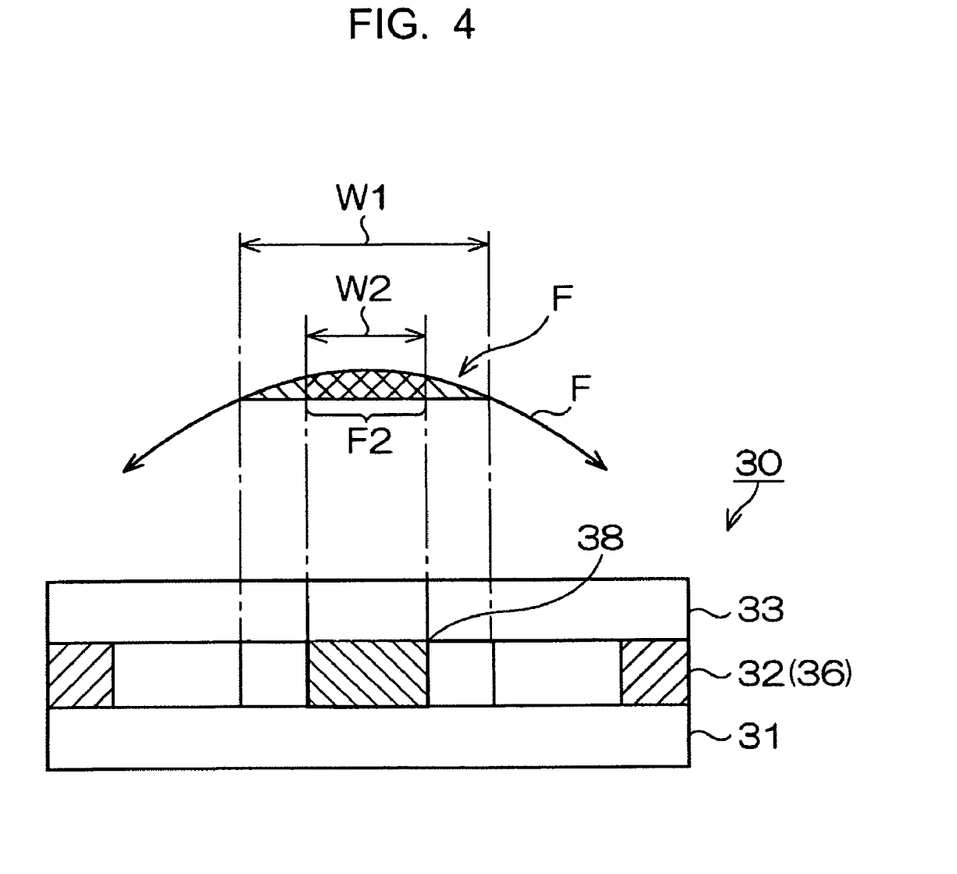
FIG. 4 illustrates an action when an external impact is applied to the piezoelectric device in FIG. 1.

FIG. 4 is a cross-sectional view taken along line IV—IV in FIG. 1. FIG. 4 illustrates the relationship between the frame 36 and forces F, F when an external impact is applied to the frame 36. When a force that corresponds to the stress on the frame 36 due to the external impact and that is transmitted to the base 38 having a width W1 is represented by F, the provision of the second cutouts 22, 22 reduces the force F to a force F2 that is transmitted through the narrowed width W2. That is, since the stress applied to the frame 36 from the external impact is reduced owing to the action of the second cutouts 22, 22 and is transmitted to the base 38, it is possible to effectively prevent the resonator element body 39 (refer to FIG. 1) from being damaged. FIG. 4 is a drawing for explaining the principle; and the size and scale of each component in FIG. 4 do not exactly coincide with those in FIG. 1.

The piezoelectric device 30 of the first embodiment can achieve a sufficient impact resistance even when the product is reduced in size.

In the piezoelectric device 30 shown in FIG. 1, the frequency is set to, for example, 30 to 40 kHz and the width W4 of each of the resonating arms 34 and 35 is set to 50 to 150 μm. When the width W2 of the second cutouts 22, 22 is less than 25% of the width W1 of the base 38, the strength is insufficient to attain sufficient impact resistance. However, when the width W2 of the second cutouts 22, 22 exceeds 75% of the width W1 of the base 38, the stress due to an impact on the frame 36 transmitted to the resonator element body 39 cannot be reduced to a sufficient level.

The present invention finds particular utility when the width W1 is less than 500 μm. At these very small widths it is difficult to use conductive adhesives to mount the base 38 in a conventional manner since the adhesive may short circuit the electrodes.

Figure 5A:
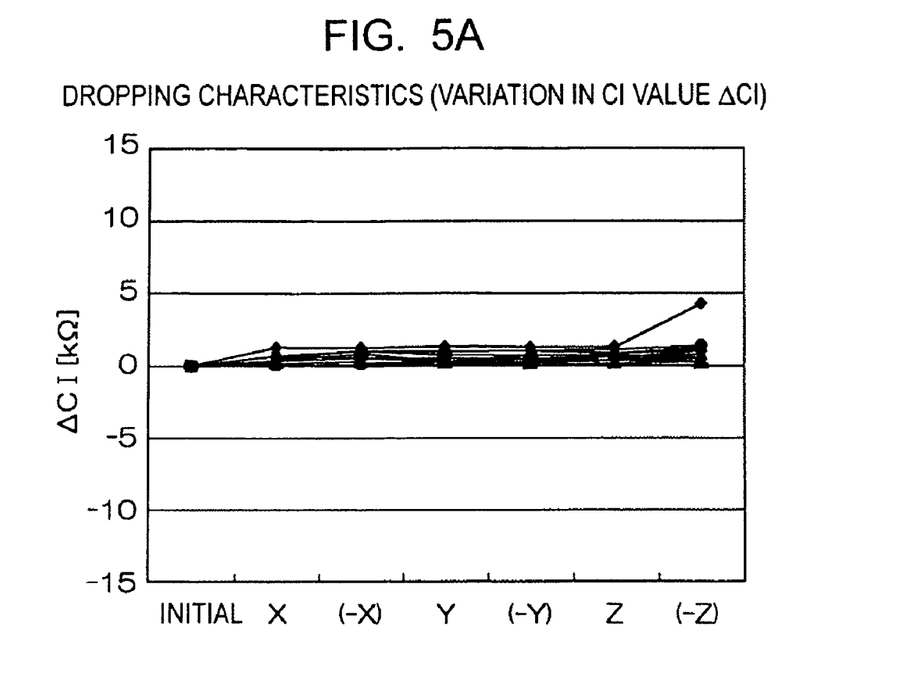
FIG. 5 includes graphs showing CI values and a change in frequency in a drop test of the piezoelectric device in FIG. 1.
Figure 5B:
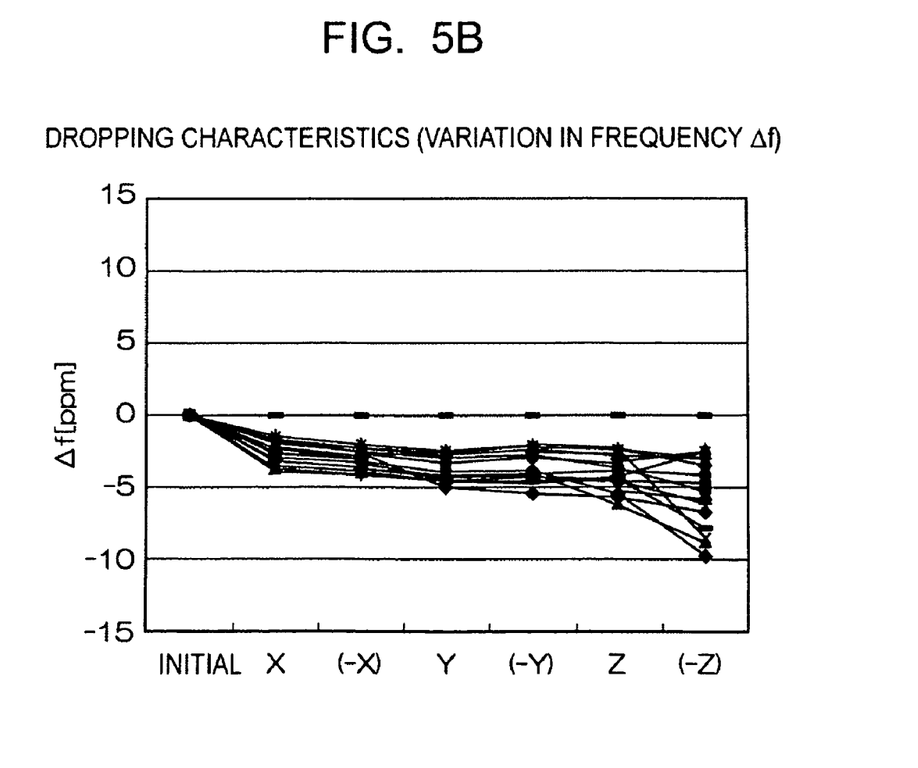

FIG. 5(a) is a graph showing the variation in CI values of the piezoelectric device 30 in FIG. 1, to which an impact is applied due to dropping. FIG. 5(b) is a graph showing the variation in frequency of the piezoelectric device 30 in FIG. 1, to which an impact is applied due to dropping. Reference letters X, Y, and Z in FIGS. 5(a) and 5(b) denote directions represented by reference letters X, Y, and Z in FIG. 1 and indicate the directions of dropping in the drop test. As shown in FIGS. 5(a) and 5(b), the piezoelectric device 30 has superior impact resistance.

When the length of the base 38 of the framed resonator element 32 in FIG. 1, indicated by reference letters BL, is around 400 μm while the base in the resonator element of the type shown in FIG. 11 has a length of around 550 μm, the piezoelectric device 30 has a CI value approximately equal to 45 kΩ (deviation is 2 kΩ), which is the same as CI values of known piezoelectric devices. This is possibly because the frame 36 is integrally adhered to the package 37 and a part that is far away from the resonating arms 34 and 35 can be fixed, compared with the known resonator element of the type shown in FIG. 11.

Figure 6:
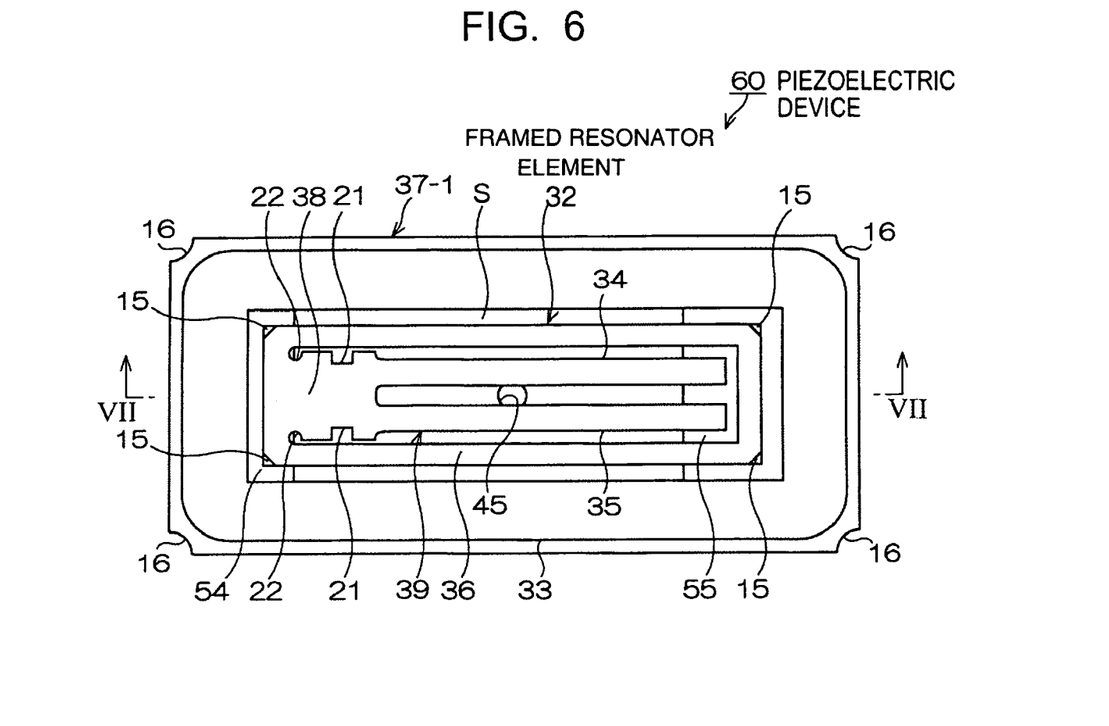
FIG. 6 is a schematic plan view of a piezoelectric device according to a second embodiment of the present invention.
Figure 7:
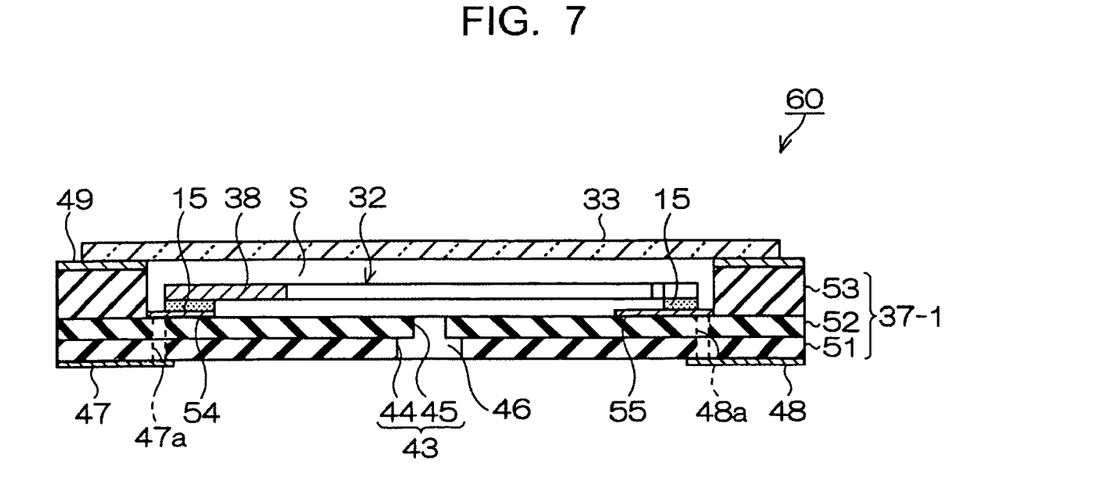
FIG. 7 is a schematic cross-sectional view of the piezoelectric device taken along line VII—VII in FIG. 6.

FIGS. 6 and 7 show a second embodiment of a piezoelectric device according to the present invention. FIG. 6 is a schematic plan view of the piezoelectric device and FIG. 7 is a schematic cross-sectional view thereof taken along line VII—VII in FIG. 6.

The same reference numerals are used in FIGS. 6 and 7 to identify the same components as in the piezoelectric device 30 of the first embodiment. A duplicated description is omitted here and only differences are mainly described.

A piezoelectric device 60 of the second embodiment is structured so as to house the framed resonator element 32 in the first embodiment in a package 37-1.

The package 37-1, made of an insulating material, is a rectangular box. For example, a first substrate 51, a second substrate 52, and a third substrate 53 are sequentially layered to form the package 37-1. A through-hole 43 is formed near the center of the package 37-1. The first substrate 51 and the second substrate 52 constitute a base substrate. The through-hole 43 is provided for discharging the gas in the package 37-1 in an annealing treatment during the manufacturing process. According to the second embodiment, the through-hole 43 includes a first aperture 44 formed in the first substrate 51 and a second aperture 45 that is formed in the second substrate 52 and that has a diameter smaller than that of the first aperture 44. The first aperture 44 communicates with the second aperture 45. The through-hole 43 is a stepped hole, as shown in FIG. 7, and is filled with a metal sealing material 46 after the degasification.

The front surface of the second substrate 52, which is an insulating base, corresponds to the inner surface of the package 37-1. Electrodes 54 and 55 are formed at opposing longitudinal ends of the second substrate 52. The electrodes 54 and 55 are connected to the mounting terminals 47 and 48 through conductive through-holes and 48a, respectively.

The electrodes 54 and 55 may be connected to the mounting terminals 47 and 48, respectively, in the same manner as in the first embodiment.

Conductive adhesives 15, 15 are applied to the electrodes 54 and 55. Conductive patterns formed on the frame 36 are applied to the conductive adhesives 15, 15 to adhere the conductive patterns to the electrodes 54 and 55. Although the framed resonator element 32 has the same structure as in FIG. 1 and is not illustrated in detail in FIGS. 6 and 7, the conductive patterns 13a and 14a shown in FIG. 1 are connected to the electrodes 54 and 55, respectively. Each of the conductive adhesives 15 is made of, for example, a synthetic resin that serves as an adhesive component (binder component) having an adhesive force and that includes a conductive filler (including conductive particles, such as fine silver particles) and a predetermined solvent.

The lid 33 is adhered to the package 37-1 with the sealing material 49.

The piezoelectric device 60 of the second embodiment having the structure described above is slightly larger than the piezoelectric device 30 of the first embodiment because the piezoelectric device 60 houses the framed resonator element 32 in the package 37-1. However, the second cutouts 22, 22 inhibit an external impact from being transmitted to the base 38 through the frame 36, as in the first embodiment. The piezoelectric device 60 of the second embodiment can basically achieve the same effect as the first embodiment.

Figure 8:
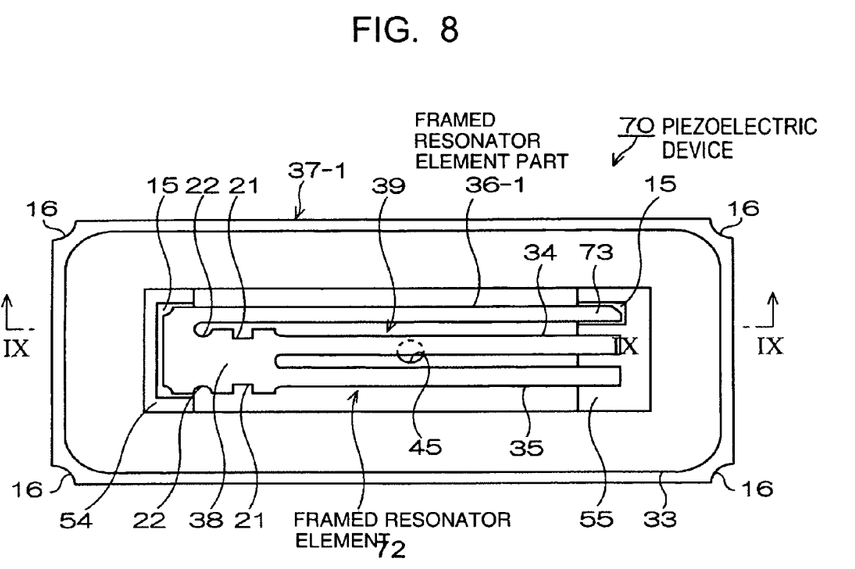
FIG. 8 is a schematic plan view of a piezoelectric device according to a third embodiment of the present invention.
Figure 9:
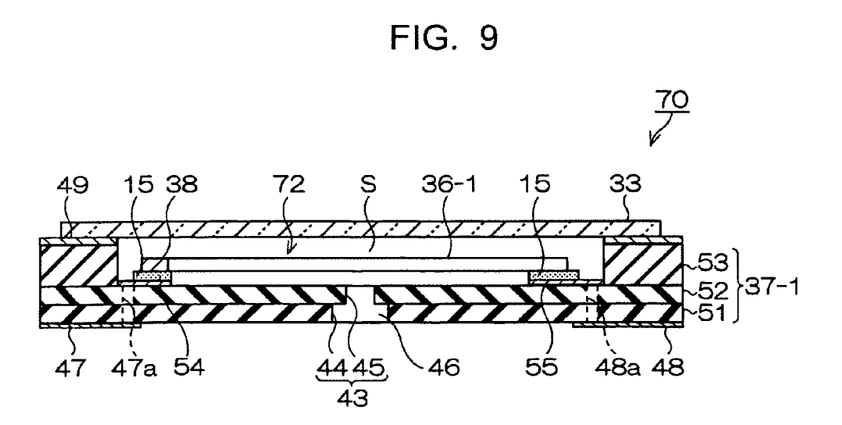
FIG. 9 is a schematic cross-sectional view of the piezoelectric device taken along line IX—IX in FIG. 8.

FIGS. 8 and 9 show a third embodiment of a piezoelectric device according to the present invention. FIG. 8 is a schematic plan view of the piezoelectric device and FIG. 9 is a schematic cross-sectional view thereof taken along line IX—IX in FIG. 8.

The same reference numerals are used in FIGS. 8 and 9 to identify the same components in the piezoelectric device 30 of the first embodiment and the piezoelectric device 60 of the second embodiment. A duplicated description is omitted here and only differences are mainly described.

A piezoelectric device 70 of the third embodiment is structured so as to house a framed resonator element 72 in the package 37-1, as in the second embodiment.

The piezoelectric device 70 of the third embodiment differs from the piezoelectric device 60 of the second embodiment in the structure of the framed resonator element 72. A framed resonator element part 36-1 of the framed resonator element 72 is not provided around the resonator element body 39, but is formed so as to extend in parallel to the resonating arms 34 and 35 from the base 38 at one side of the resonator element body 39. A conductive pattern extending from an excitation electrode (not shown) is provided at a tip 73 of the framed resonator element part 36-1. This conductive pattern is similar to the conductive patterns 14a in FIG. 1. In addition, a conductive pattern (not shown) similar to the conductive pattern 13a in FIG. 1 is provided on the framed resonator element part 36-1 at the base 38 side.

As shown in FIGS. 8 and 9, the conductive patterns at the base 38 side and at the tip 73 of the framed resonator element part 36-1 are adhered to the electrodes 54 and 55 with the corresponding conductive adhesives 15, 15.

The piezoelectric device 70 of the third embodiment having the structure described above can achieve the same effect as in the second embodiment. Furthermore, since the framed resonator element part 36-1 has a rod-like shape and is provided only at one side of the resonating arm 34, the mass of the framed resonator element part 36-1 is less than the rectangular frame 36 in the second embodiment, thus reducing the damage by any external impact.

Figure 10:
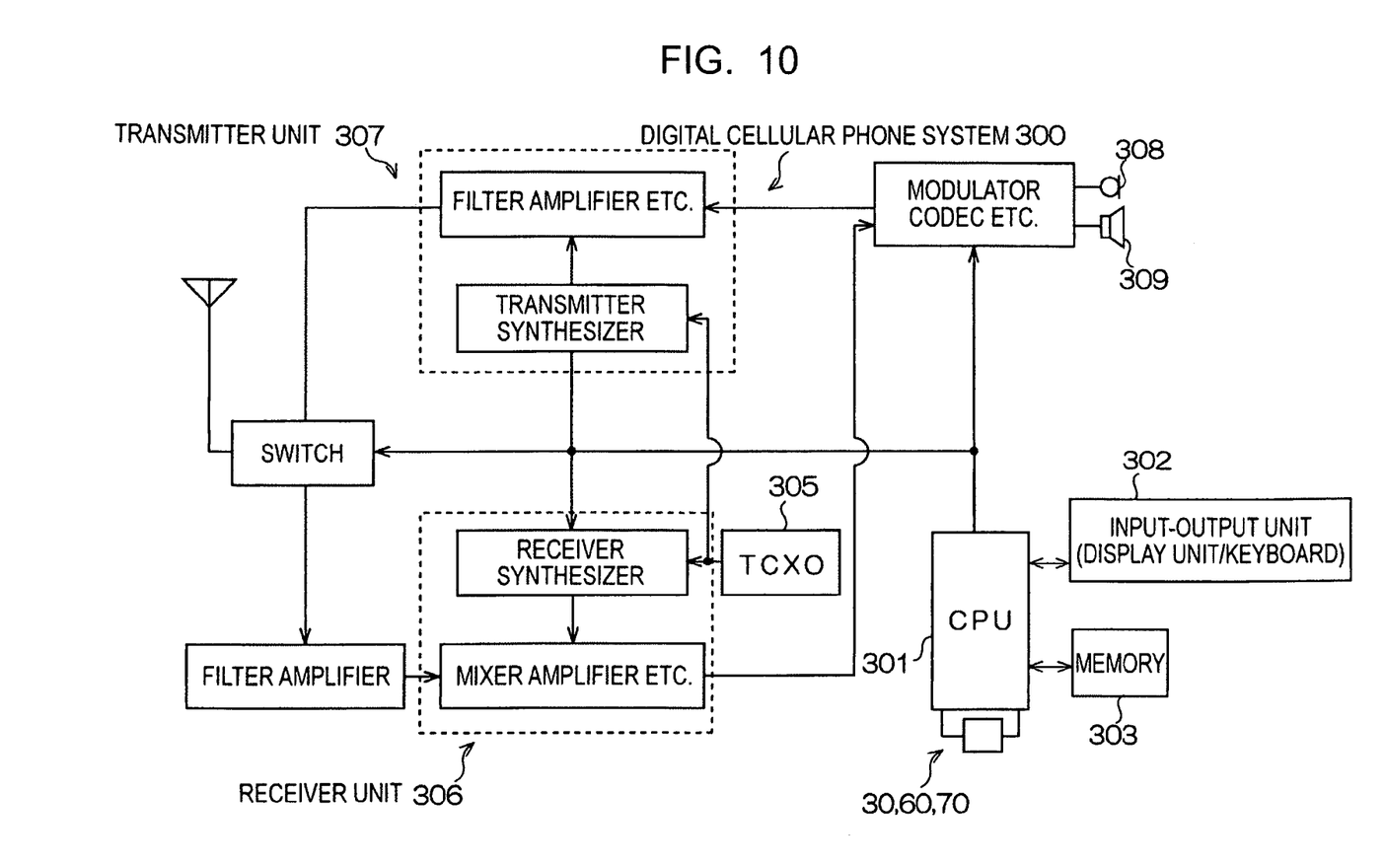
FIG. 10 is a block diagram schematically showing the structure of a digital cellular phone system as an example of electronic equipment using the piezoelectric device according to any of the above embodiments.

FIG. 10 is a block diagram schematically showing the structure of a digital cellular phone system as an example of electronic equipment using the piezoelectric device according to any of the above embodiments of the present invention.

Referring to FIG. 10, a digital cellular phone system 300 has a microphone 308 for receiving the voice of a caller and a speaker 309 for outputting the received voice. The digital cellular phone system 300 further includes a central processing unit (CPU) 301, such as an integrated circuit, functioning as a controller connected to a modem for transmitted and/or received signals.

The CPU 301 not only modulates and/or demodulates the transmitted and/or received signals, but also controls a liquid crystal display (LCD) serving as an image display unit, an input-output unit 302 including operation keys for inputting information, and an information storage unit (memory) 303 including a RAM or ROM. Accordingly, the piezoelectric device 30, the piezoelectric device 60, the piezoelectric device 70, or the like is connected to the CPU 301, and the output frequency from the piezoelectric device is used as a clock signal appropriate for the control by using a predetermined frequency divider (not shown) included in the CPU 301. The piezoelectric device 30 or the like attached to the CPU 301 may be an oscillator having the piezoelectric device 30 or the like combined with a predetermined frequency divider, instead of a simple piezoelectric device.

The CPU 301 is also connected to a temperature compensated crystal oscillator (TCXO) 305 that is connected to a transmitter unit 307 and a receiver unit 306. Accordingly, even when a basic clock from the CPU 301 is varied due to a change in ambient temperature, the basic clock from the CPU 301 is corrected by the temperature compensated crystal oscillator 305 and the corrected clock is supplied to the transmitter unit 307 and the receiver unit 306.

As described above, the piezoelectric device according to any of the above embodiments can be used in electronic equipment, such as the digital cellular phone system 300 having the controller. The piezoelectric device according to any of the above embodiments highly resists an external impact even when it is greatly reduced in size, thus improving the reliability of the product.

The present invention is not limited to the above embodiments. The structures of the above embodiments may be combined with each other or may be combined with other structures, or part of the structures may be omitted.

The present invention can be applied to any piezoelectric device, regardless of the name, including a piezoelectric transducer or a piezoelectric oscillator, as long as the piezoelectric device has a resonator element housed in a package.

What is claimed is:

1. A piezoelectric device having a resonator element housed in a package, the piezoelectric device comprising:
   a base substrate;
   a framed resonator element on the base substrate, the resonator element having plurality of resonating arms and a surrounding frame; and
   a lid on the resonator element for hermetically sealing a space within the package,
   wherein the framed resonator element includes a base having a predetermined width, the base being integrally formed with inner portions of the frame; the plurality of resonating arms extending parallel to each other from the base; first cutouts in the base adjacent to inner ends of the resonating arms ,the first cutouts narrowing the width of the base; and second cutouts that are formed where the base joins the frame, the second cutouts narrowing the width of the base.

2. The piezoelectric device according to claim 1, wherein the width of the second cutouts is 25% to 75% of the width of the base.

3. The piezoelectric device according to claim 1, wherein the width of the base is less than 500 μm.

4. The piezoelectric device according to claim 1, wherein each of the resonating arms of the resonator element has grooves extending in the longitudinal direction of the resonating arm and excitation electrodes are formed in the grooves.

5. A piezoelectric device having a resonator element housed in a package, the piezoelectric device comprising:
   a base substrate forming a bottom of the package;
   a framed resonator element adhered on the base substrate; and
   a lid for housing the framed resonator element in the package to hermetically seal the package,
   wherein the framed resonator element includes a rectangular frame; a base having a predetermined width, which is integrally formed inside the frame; a plurality of resonating arms that extend in parallel to each other from the base in one direction; first cutouts in the base adjacent to inner ends of the resonating arms, the first cutouts narrowing the width of the base; and second cutouts that are formed where the base joins the frame, the second cutouts further narrowing the width of the base.

6. A cellular phone system comprising:
   a piezoelectric device that has a resonator element housed in a package, the piezoelectric device having a base substrate constituting the bottom of the package; a framed resonator element layered on the base substrate; and a lid for hermetically sealing a space within the package, the lid being layered on the framed resonator element, wherein the framed resonator element includes a frame constituting a wall surrounding the space within the package; a base having a predetermined width, which is integrally formed inside the frame; a plurality of resonating arms that extend in parallel to each other from the base in one direction in the frame; first cutouts in the base adjacent to ends of the resonating arms, the first cutouts narrowing the width of the base; and second cutouts that are formed where the base joins the frame, the second cutouts further narrowing the width of the base, and wherein the cellular phone system receives a clock signal for control by using the piezoelectric device.

7. Electronic equipment comprising:

a piezoelectric device that has a resonator element housed in a package, the piezoelectric device having a base substrate constituting the bottom of the package; a framed resonator element layered on the base substrate; and a lid for hermetically sealing a space within the package, the lid being layered on the framed resonator element, wherein the framed resonator element includes a frame constituting a wall surrounding the space within the package; a base having a predetermined width, which is integrally formed inside the frame; a plurality of resonating arms that extend in parallel to each other from the base in one direction in the frame; first cutouts in the base adjacent to inner ends of the resonating arms, the first cutouts narrowing the width of the base; and second cutouts that are formed where the base joins the frame, the second cutouts further narrowing the width of the base, and wherein the electronic equipment receives a clock signal for control by using the piezoelectric device.

* * * * *